(12) United States Patent
Eugene Lee et al.

(10) Patent No.: US 9,275,983 B2
(45) Date of Patent: Mar. 1, 2016

(54) INTEGRATED CIRCUIT PACKAGE

(71) Applicant: Texas Instruments Incorporated, Dallas, TX (US)

(72) Inventors: Lee Han Meng@ Eugene Lee, Johor (MY); Anis Fauzi bin Abdul Aziz, Melaka (MY); Yien Sien Khoo, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/706,052

(22) Filed: May 7, 2015

(65) Prior Publication Data

US 2015/0243641 A1    Aug. 27, 2015

Related U.S. Application Data

(62) Division of application No. 13/734,246, filed on Jan. 4, 2013, now Pat. No. 9,029,990.

(51) Int. Cl.
| | |
|---|---|
| *H04L 21/00* | (2006.01) |
| *H01L 25/00* | (2006.01) |
| *H01L 23/495* | (2006.01) |
| *H01L 21/56* | (2006.01) |
| *H01L 23/498* | (2006.01) |
| *H01L 25/16* | (2006.01) |
| *H01L 23/31* | (2006.01) |
| *H01L 23/00* | (2006.01) |

(52) U.S. Cl.
CPC .............. *H01L 25/50* (2013.01); *H01L 21/565* (2013.01); *H01L 23/49531* (2013.01); *H01L 23/49537* (2013.01); *H01L 23/49541* (2013.01); *H01L 23/49568* (2013.01); *H01L 23/49575* (2013.01); *H01L 23/49838* (2013.01); *H01L 24/81* (2013.01); *H01L 24/97* (2013.01); *H01L 25/165* (2013.01); *H01L 23/3107* (2013.01); *H01L 23/49589* (2013.01); *H01L 24/06* (2013.01); *H01L 24/13* (2013.01); *H01L 24/16* (2013.01); *H01L 24/29* (2013.01); *H01L 24/32* (2013.01); *H01L 24/33* (2013.01); *H01L 24/83* (2013.01); *H01L 2224/0401* (2013.01); *H01L 2224/04026* (2013.01); *H01L 2224/06181* (2013.01); *H01L 2224/131* (2013.01); *H01L 2224/16245* (2013.01); *H01L 2224/291* (2013.01); *H01L 2224/32245* (2013.01); *H01L 2224/33181* (2013.01); *H01L 2224/8121* (2013.01); *H01L 2224/81801* (2013.01); *H01L 2224/81815* (2013.01); *H01L 2224/8321* (2013.01); *H01L 2224/83192* (2013.01); *H01L 2224/83815* (2013.01); *H01L 2924/12* (2013.01); *H01L 2924/1306* (2013.01); *H01L 2924/14* (2013.01); *H01L 2924/181* (2013.01)

(58) Field of Classification Search
CPC .. H01L 2224/92; H01L 2224/97; H01L 24/97
USPC ......................................... 438/111, 123, 127
See application file for complete search history.

(56) References Cited

U.S. PATENT DOCUMENTS 6,998,702 B1 *  2/2006  Zwenger et al. .............. 257/679
7,408,245 B2 *  8/2008  Hung et al. ................... 257/666
(Continued)

*Primary Examiner* — S. V. Clark
(74) *Attorney, Agent, or Firm* — Steven A. Shaw; Frank D. Cimino

(57) ABSTRACT

A method of making an integrated circuit (IC) package including electrically and physically attaching a die to an interposer, attaching the interposer to a bottom leadframe, attaching a discrete circuit component to the interposer and attaching a top leadframe to the bottom leadframe.

9 Claims, 6 Drawing Sheets

(56) References Cited

U.S. PATENT DOCUMENTS

| | | | |
|---|---|---|---|
| 2008/0122113 A1* | 5/2008 | Corisis et al. | 257/777 |
| 2009/0302441 A1* | 12/2009 | Fan | 257/666 |
| 2013/0087894 A1* | 4/2013 | Elliott et al. | 257/622 |
| 2014/0191378 A1* | 7/2014 | Lee et al. | 257/668 |

* cited by examiner

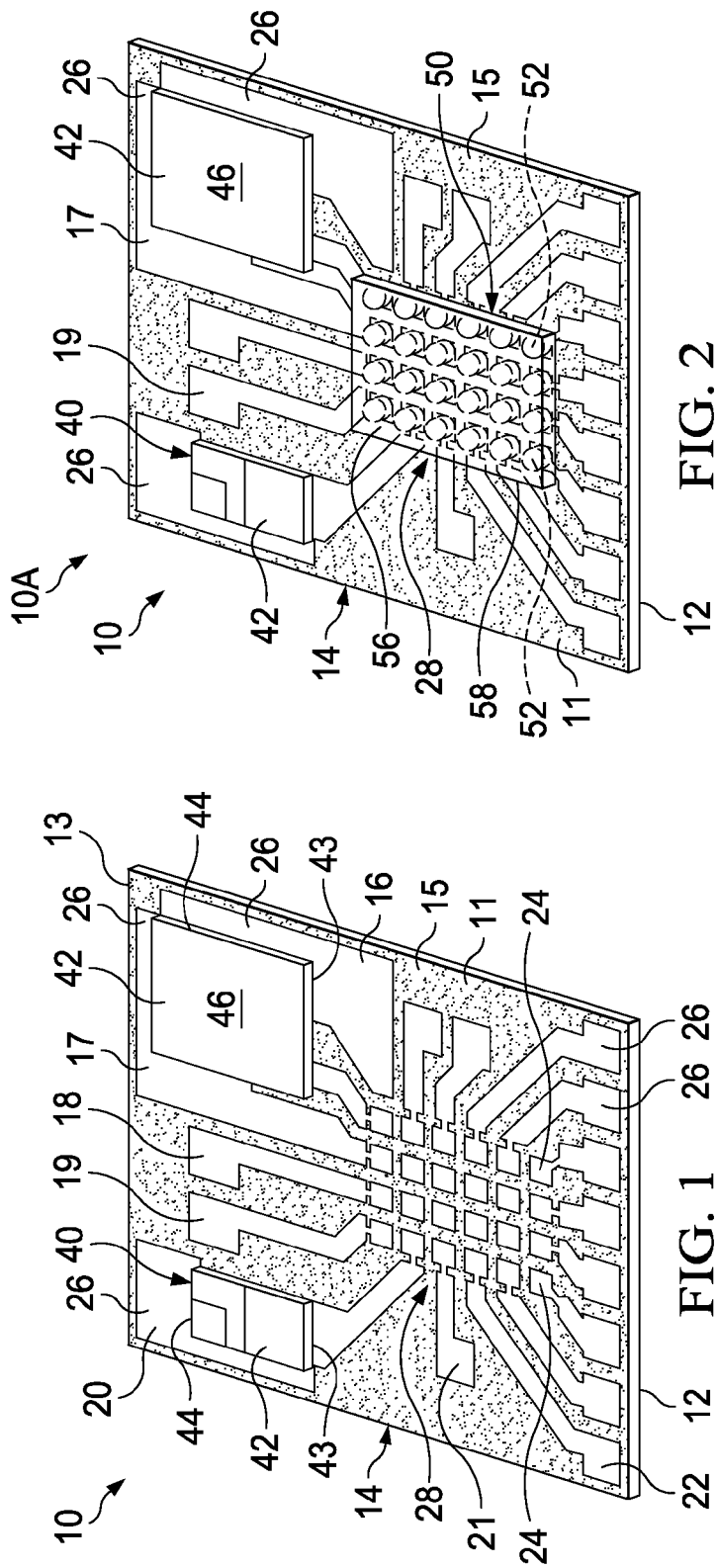

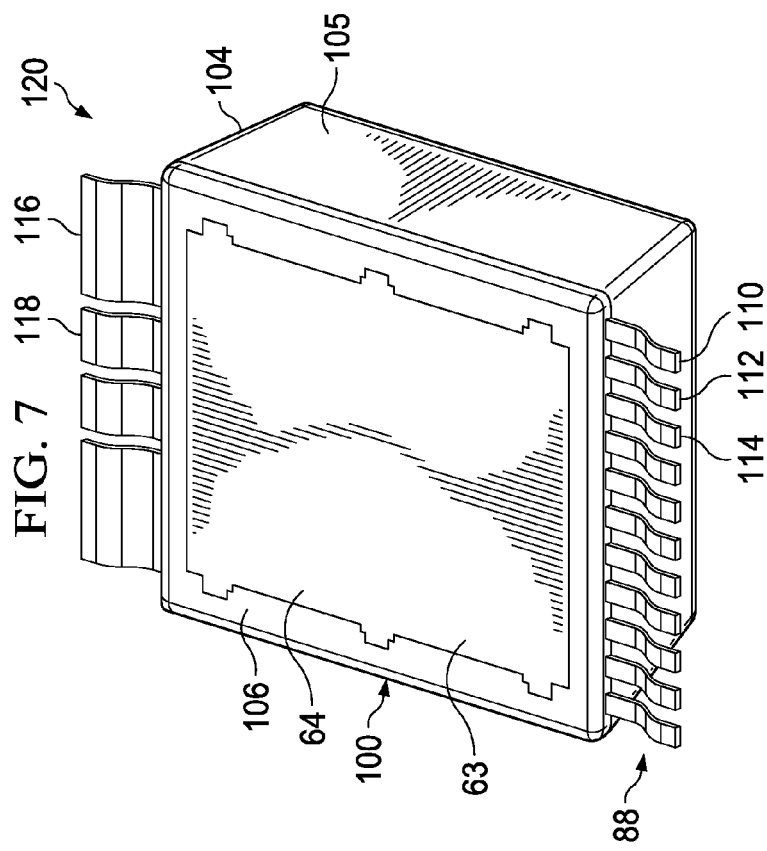
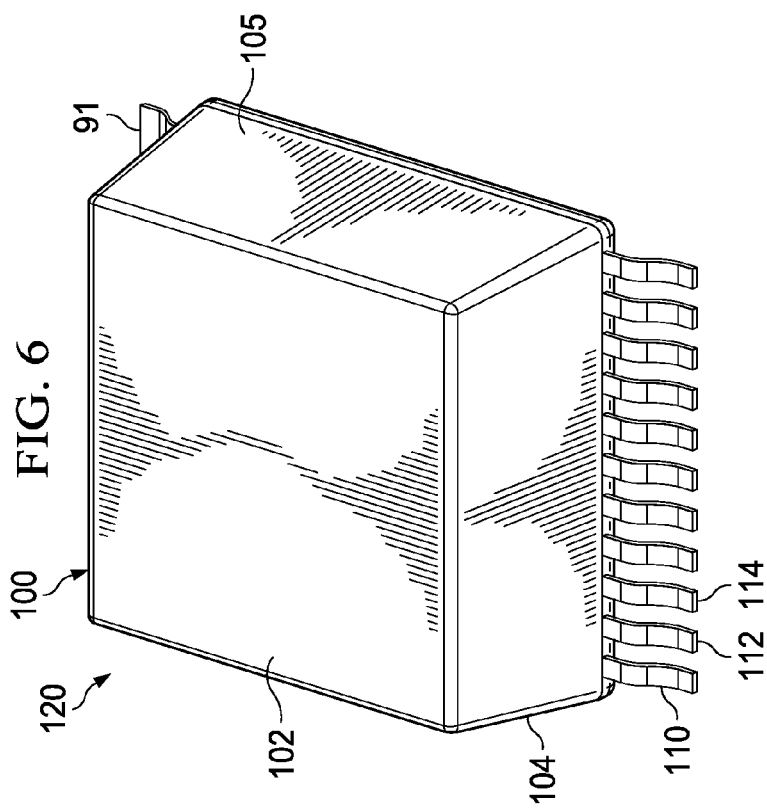

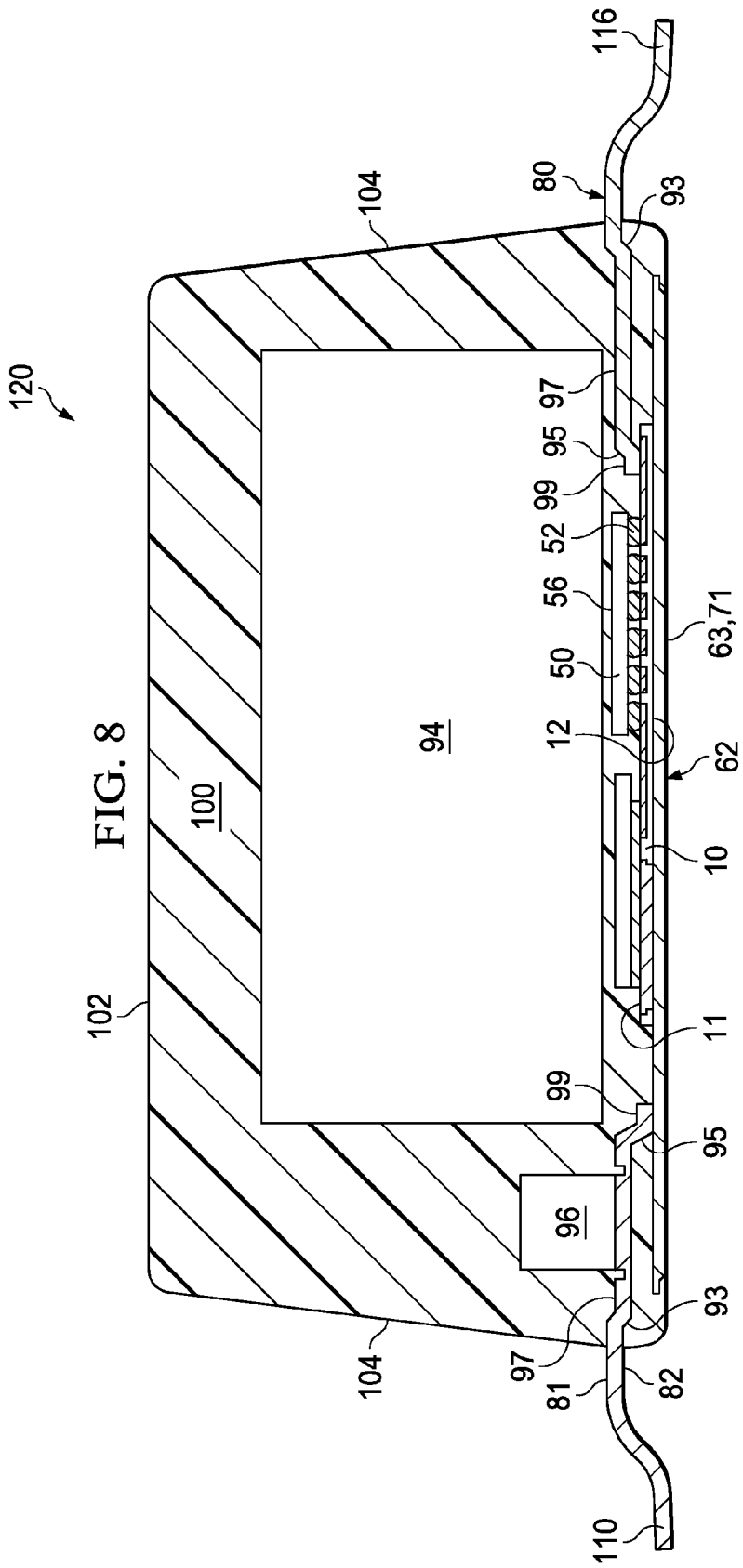

INTEGRATED CIRCUIT PACKAGE

CROSS-REFERENCE TO RELATED APPLICATIONS

This application is a Divisional of and claims priority to U.S. patent application Ser. No. 13/734,246, filed on Jan. 4, 2013—now U.S. Pat. No. 9,029,990 issued on May 12, 2015. Said application incorporated herein by reference in its entirety.

BACKGROUND

Integrated circuit (IC) packages are used in many modern electronic applications. A continuing challenge for designers is to provide IC packages having complex circuits with high power requirements, good heat dissipation and flexible signal routing in a compact package. Such IC packages are particularly desirable in small devices, such as cell phones and tablet computers, where components must fit into a very limited space. The methods of manufacturing such IC packages should be as fast and cost effective as possible, consistent with the production of high quality IC packages.

BRIEF DESCRIPTION OF THE DRAWINGS

FIG. 1 is a top isometric view of an interposer having two FETs mounted thereon.

FIG. 2 is a top perspective view of the interposer of FIG. 1 and further including a flipchip die mounted on the interposer.

FIG. 6 is a top isometric view of the assembly of FIG. 5 after molding, package singulation, trimming, forming, and plating to form an integrated circuit ("IC") package.

FIG. 7 is a bottom isometric view of the integrated circuit package of FIG. 6.

FIG. 8 is a cross sectional elevation view of the IC package of FIGS. 6 and 7.

DETAILED DESCRIPTION

Figure 3:
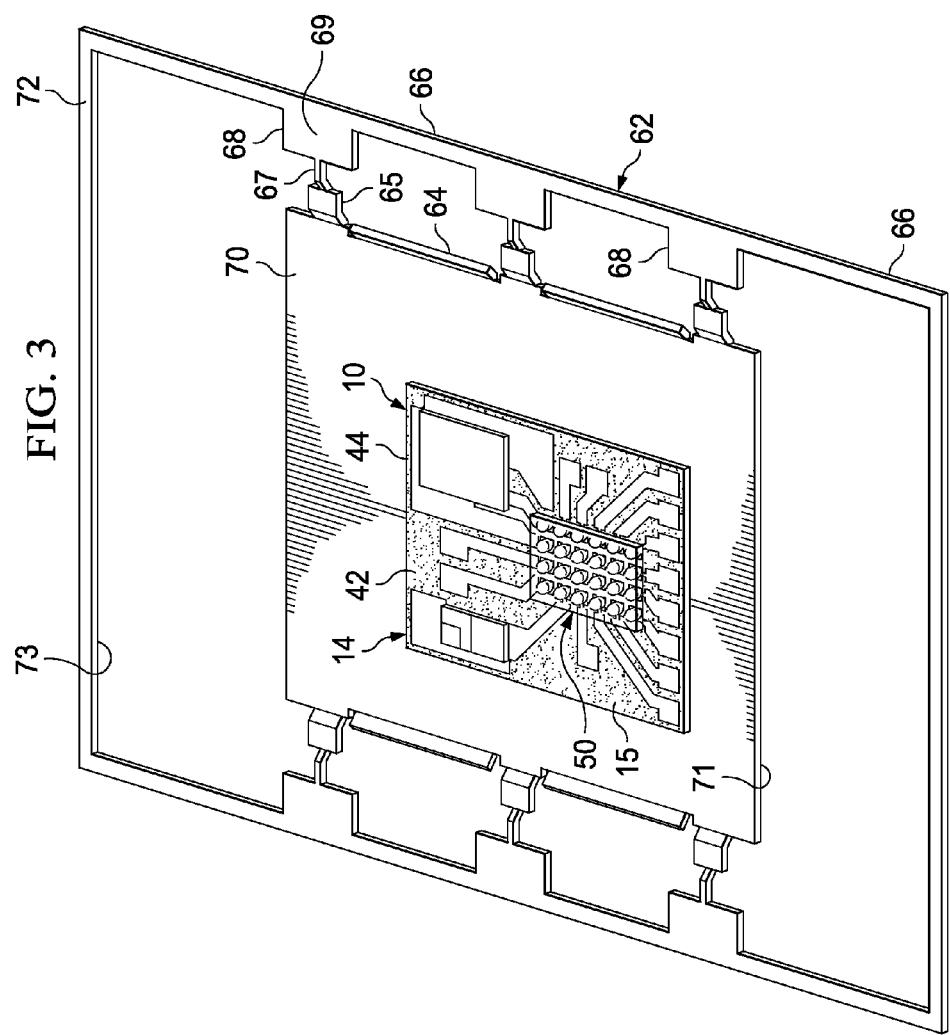
FIG. 3 is a top isometric view of the interposer of FIG. 2 mounted on an attachment pad portion of a bottom leadframe.

This application, in general, discloses an integrated circuit (IC) package 120 including a bottom leadframe 62, an interposer 10 mounted on the bottom leadframe 62, a flipchip die 50 mounted on the interposer 10 and a top leadframe 80 electrically connected to the interposer 10. Also, a method of making an integrated circuit (IC) package 120 including electrically and physically attaching a die 50 to an interposer 10, attaching the interposer 10 to a bottom leadframe 62, attaching a first circuit component 40 to the interposer 10 and attaching a top leadframe 80 to the bottom leadframe 62.

Having thus generally described an integrated circuit package 120 and a method of making an integrated circuit package, the package 120 and the method will now be described in further detail. FIG. 1 is a top isometric view of an interposer 10. The interposer 10 has two structural components: a leadframe 14 and a layer of mold compound 15 that fills the voids in the leadframe 14. The mold compound 15 is indicated by speckles in FIGS. 1-4. The interposer 10 has a flat top face surface 11. The leadframe 10 and mold compound 15 are flush with each other on the top face surface 11. The interposer 10 has a bottom face surface 12, shown in cross section in FIG. 8, in which only one portion of the leadframe 14 is visible. The portion of the leadframe 14 that is not visible on the bottom face surface 12 is half etched and covered by mold compound 15. The interposer 10 has a rectangular peripheral edge 13. The interposer leadframe 14 defines a plurality of leads 16-22, etc., which each have an inner pad portion 24 and an outer pad portion 26. The inner pad portions 24 are located within a rectangular die mounting region 28. Some or all of the inner pad portions 24 may be necked and/or half etched to improve solder control during bonding of a flipchip die 50 thereto, as described below. The interposer 10, in one embodiment, may have a thickness of about 0.2 mm, a longitudinal dimension of about 9.1 mm and a lateral dimension of about 6.6 mm. The interposer leadframe 14 is formed from a conductive material such as, for example, copper and may have a thickness of about 0.1 mm in half etched portions and 0.2 mm in other portions.

A field-effect transistor or "FET" is a transistor that uses an electric field to control the conductivity of a channel of one type of charge carrier in a semiconductor material. Each FET has three terminals, a source terminal, a drain terminal, and a gate terminal. A first and second FET 40, 46 are operably mounted on the interposer 10. Each FET has a top face 42, an opposite bottom face 43 and a generally rectangular peripheral edge 44. Each FET is mounted bottom face 43 down on the interposer 10, in contact with at least one outer pad portion 26 of one or more leads 16-22, etc. At least one terminal contact surface (not shown) on the bottom face 43 of each FET 40, 46 is placed in electrical contact with the below lying lead inner pad portion(s) 24 of interposer leadframe 14 and is bonded thereto as by solder, described in further detail below.

As shown in FIG. 2, a flipchip die 50 has solder bumps 52 protruding from a bumped face surface 54 (FIG. 8), a back surface 56 and a rectangular peripheral edge 58. In the illustrated embodiment, each solder ball 52 is bonded to one or more inner pad portions 24 (FIG. 1) of the interposer leadframe 14 as described in further detail below.

FIG. 3 illustrates a bottom leadframe 62 has a generally rectangular attachment pad portion 64 suspended from a peripheral frame portion 66 by a plurality of integrally formed support structures 68. Each support structure 68 may include a rectangular pad portion 69 positioned adjacent to the peripheral frame portion 66 which lies in substantially the same plane as the frame portion 66. An inwardly and downwardly extending rod portion 69 is attached at an upper end to plate portion 69 and at a lower end to an inwardly and downwardly extending inverted L-shaped flange portion 65. The lower end of flange portion 65 is attached to the attachment pad portion 64. As a result of this generally inwardly and downwardly extending configuration of the support structures 68, each attachment pad portion is positioned in a plane below the plane of the peripheral frame portion 66. The attachment pad portion 64 has a top face surface 70 and a bottom face surface 71. The peripheral frame portion has a top face surface 72 and a bottom face surface 73. In one embodiment, the bottom leadframe 62 is made from copper which may have a thickness of about 0.2 mm. The generally rectangular attachment pad portion 64 may have dimensions of about 12 mm by 13.5 mm and the generally rectangular peripheral frame portion 66 may have dimensions of about 15 mm by 24.1 mm. The bottom face surface 12 of the interposer 10 leadframe 14 is attached to the top face surface 70 of the attachment pad portion 64 as by solder.

Figure 4:
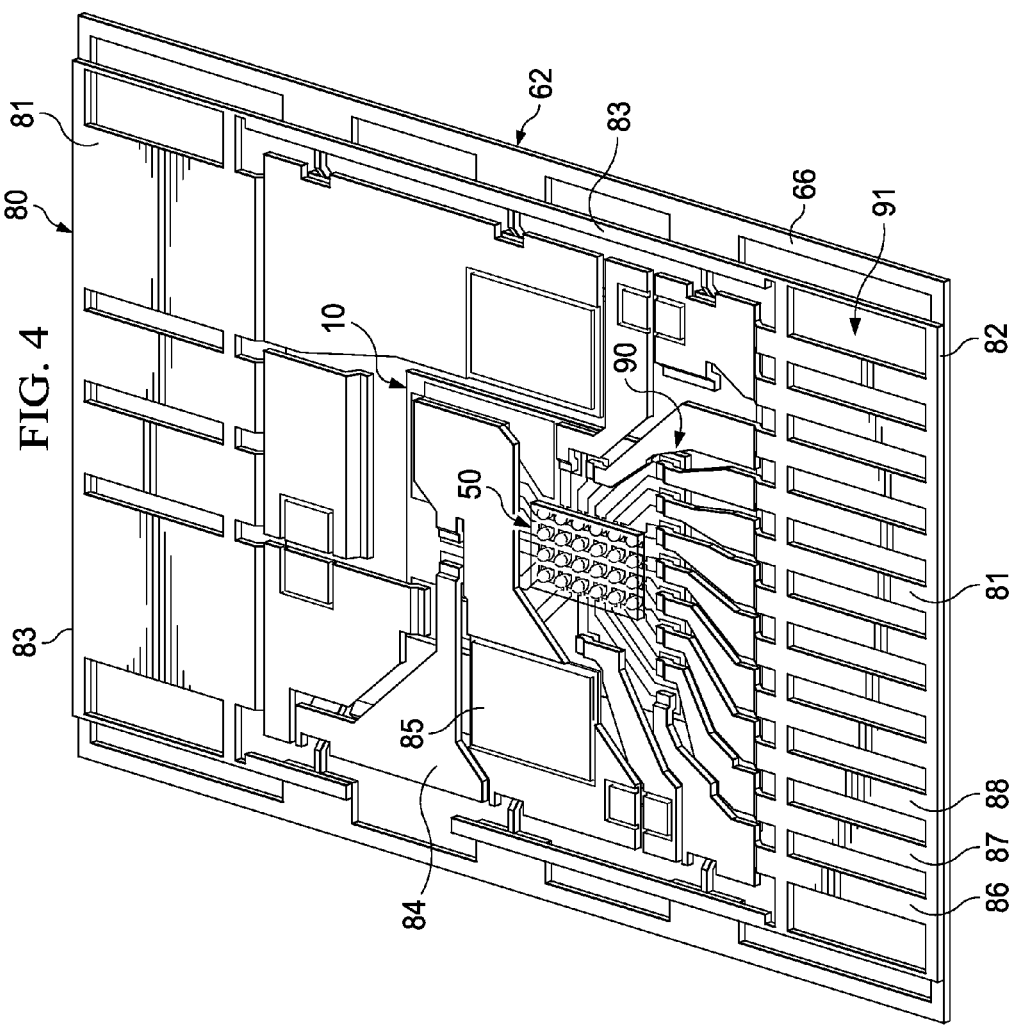
FIG. 4 is a top isometric view of the interposer and leadframe of FIG. 3 attached to a top leadframe.

As illustrated by FIG. 4, a top leadframe 80 may have a generally rectangular shape with a top face surface 81, a bottom face surface 82 and a rectangular peripheral edge 83. The two longitudinal ends of the top lead frame 80 are attached to the two longitudinal ends of the peripheral frame portion 66 of the bottom lead frame 62. The longitudinally extending sides of the top leadframe are supported on the rectangular pad portions 69 of the attachment pad support structures 68. Thus, the top leadframe is positioned in approximately the same plane as the bottom leadframe peripheral frame portion 66.

The top leadframe 80 has a plurality of lead portions 84-88, etc., each having an inner portion 90 and an outer portion 91. The outer portion 91 of each lead portion 84-88 is relatively flat. The inner portion 90 of each lead portion 84-88, etc. has a double downset configuration which is most clearly seen in profile in FIG. 8. The double downset includes a first downwardly and inwardly extending bend portion, or downset portion 93 and a second inwardly and downwardly extending lead portion or downset portion 95. Downset portions 93 and 95 are connected by a relatively straight intermediate portion 97. The second downset portion 95 terminates in a tab portion 99. The tab portion 99 of each top leadframe lead 84-88 may contact and be soldered to either a portion of the bottom leadframe attachment pad portion 64 or the interposer leadframe 14. The double downset configuration of the lead inner portions provides good stack up connection and the tab connections to the electrical conductor surface below it provide good electrical conduction especially at high current densities.

Figure 5:
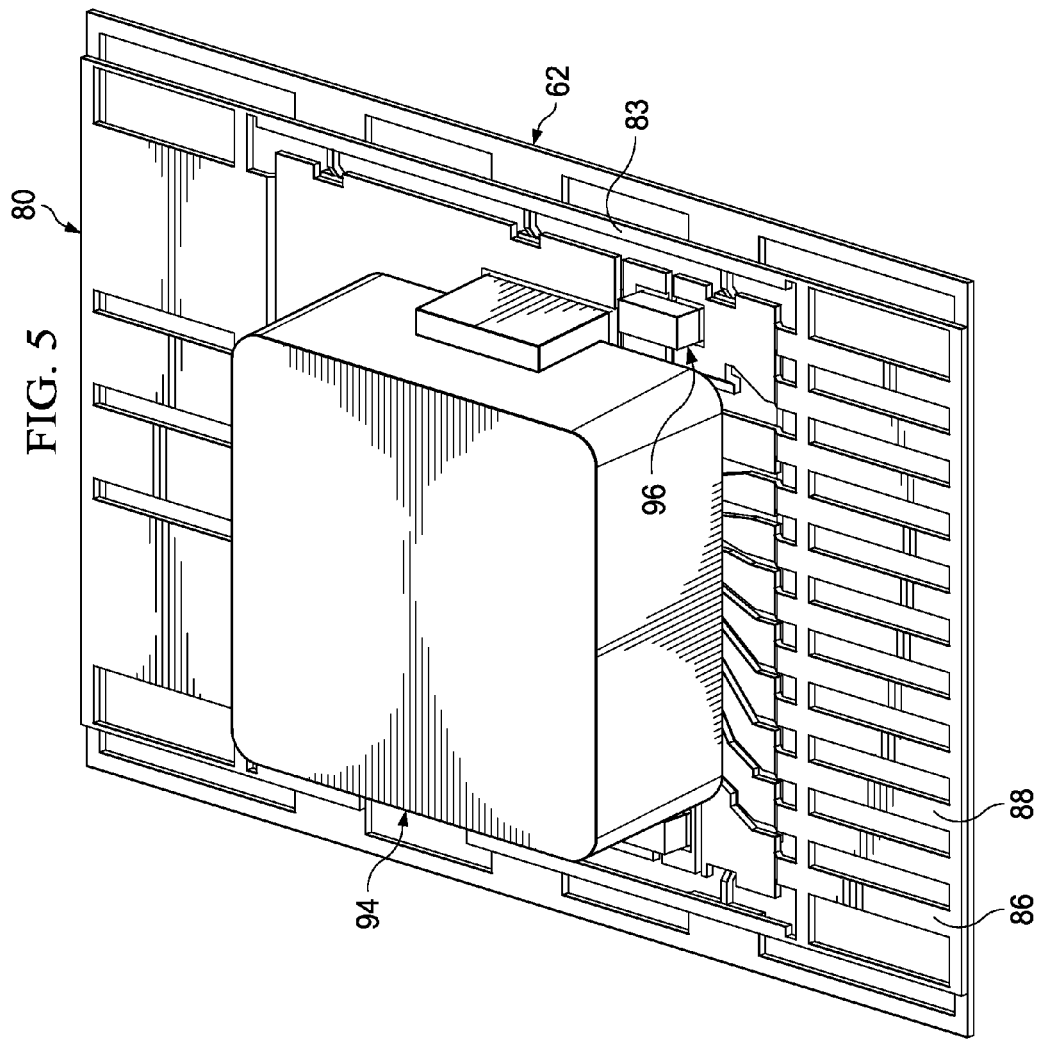
FIG. 5 is a top isometric view of the assembly of FIG. 4 with a passive circuit component mounted thereon.

FIG. 5 illustrates the dual lead frame assembly of FIG. 4 with two generally box-shaped discrete passive circuit components 94, 96 physically and electrically attached to the top lead frame 80. Contact surfaces on the bottom face of each passive circuit component 94, 96 are connected to lead portions of the top lead frame 80. In one embodiment the larger passive circuit component 94 may have dimensions of, for example, 10 mm by 11.5 mm by 4.5 mm and the smaller component 96 may have dimensions of, for example, 0.8 mm by 1.6 mm by 0.8 mm.

Each encapsulated, plated and singulated assembly shown in FIGS. 6-8 is a complete IC package 120. The assembly of FIG. 5 is encapsulated in mold compound, which cures into a hard protective encapsulant 100. The encapsulant 100, after singulation, may have a generally box-shaped configuration having a generally rectangular top face surface 102 and generally trapezoidal front and rear side faces 104 and left and right lateral side faces 105. A generally rectangular bottom face 106 has an opening therein exposing the bottom surface 63 of the bottom leadframe attachment pad portion 64. Extending from the bottom portion of each front and rear side face 104 are a plurality of leads 110, 112, 114, 116, 118, etc., corresponding to top leadframe leads 80-88, etc. The exposed bottom surface 63 of the pad portion 64 and the leads 110, 112, etc., may be metal plated as for example with tin. As best shown by FIG. 8, each of the plated leads, e.g., 110, 116, etc., may have a generally flattened S-shaped configuration.

Thus, the finished structure and composition of an IC package 120, as well as the structure of the components and some of the intermediate assemblies produced in making the IC packages 120 have been described. Methods of making such IC packages 120 will now be described. Initially, an interposer strip (not shown) having a plurality of identical, integrally connected interposers 10 arranged in a grid, which may be, e.g., 230 mm in length and 62 mm wide, is provided. The method of making an interposer strip by molding of a leadframe strip is known in the art. Next FETs 40, 46 are mounted, as with a pick and place machine, on predetermined portions of the interposer leadframe 14 that have been coated with a conductive adhesion agent, such as solder paste. Next a flip chip die 50 is soldered to area 28 of each interposer leadframe 14 in the interposer strip as described above with reference to FIG. 2, as by heating the interposer strip in a reflow oven. The solder for attaching the FETS and the solder for attaching the dies 50 may both be reflowed at the same time. Thus, FIG. 2, except in strip form, represents an intermediate product that is placed in the reflow oven in one method embodiment. Next, the interposer strip (not shown) is singulated to produce individual interposer assemblies 10A as shown and described above with reference to FIG. 2.

A bottom leadframe strip (not shown) having a grid of integrally connected bottom leadframes 62, as described above with reference to FIG. 3, is provided. Each bottom leadframe strip may be, e.g., 224 mm long and 70 mm wide, although other strip configurations could also be used. Solder paste (not shown) may next be applied to the attachment pad portion 64 of each bottom leadframe 62 on the strip with a suitable applicator. One of the singulated interposers assemblies 10A is placed on each solder paste layer on the attachment pad portions 64, as with a pick and place machine (not shown). A top leadframe strip (not shown) having an array of top leadframes 80 corresponding to the bottom leadframes 62 on the bottom leadframe strip is also provided. Solder paste is applied to either or both of the top and bottom leadframe strips and to portions of each interposer leadframe 14 that is to be attached to leads on each corresponding top leadframe 80. The assembled top and bottom leadframe strips (a portion of such an assembly is shown in FIG. 4) are then sequentially moved to an oven where the solder between the leadframes and the solder between the bottom leadframe and the interposer may be reflowed at the same time. In another embodiment the solder between the bottom leadframe and the interposer is reflowed first. Solder bonds are thus formed between some of the top leadframe lead portions 85-88, etc., and the outer lead portions 26 of the leads of the interposer leadframe 14. Solder bonds may also be made between some of the top leadframe lead portions 84-88, etc., and portions of the corresponding bottom leadframe 62.

Each dual leadframe 62/80 as shown in FIG. 4 (except that the lead frames are in dual strip form) may next be moved to a passive circuit component attachment station where solder paste may be applied to predetermined portions of the top surface 81 of the top lead frame 80. Next the passive circuit components 94, 96, FIG. 5, are placed on the predetermined solder paste covered portions. Then the dual strip 62/80 of FIG. 5 is moved to a reflow oven and the solder is reflowed to bond the passive components 94, 96 to the top leadframe 80.

The dual leadframe assembly with attached passive circuit components, as shown in FIG. 5, except in strip form, is next moved to a mold station, such as a transfer mold (not shown). Heated mold compound is applied to cover the entire assembly, except for protruding leads 84, etc., from top leadframe 80 and a bottom surface 63 of each bottom leadframe attachment pad portion 64. The mold compound is allowed to cure and becomes a hard protective shell 100 around the encapsulated die 50, FETs 40, 46, passive circuit components 94, 96 and portions of the bottom and top leadframes 62, 80 of each dual leadframe strip.

Next the dual leadframe strips are singulated into individual IC packages 120. Singulation removes the peripheral frame portion 66 of each bottom leadframe 62 and the attached longitudinal side portions of each top leadframe 80. The outwardly extending leads 110, 112, 114, etc. corresponding to the top leadframe lead portions 84, 85, etc., are trimmed and formed by processes known in the art into the flattened S-shaped configurations shown in FIGS. 6-8.

Finally the individual packages 120 are moved to a plating station where metal such as tin is plated onto the extending leads 110, 112, 114, etc., as by any of the conventional plating processes known in the art. The bottom surface 63 of bottom leadframe attachment pad portions 64 may be metal plated in the same manner at the same time.

Figure 9:
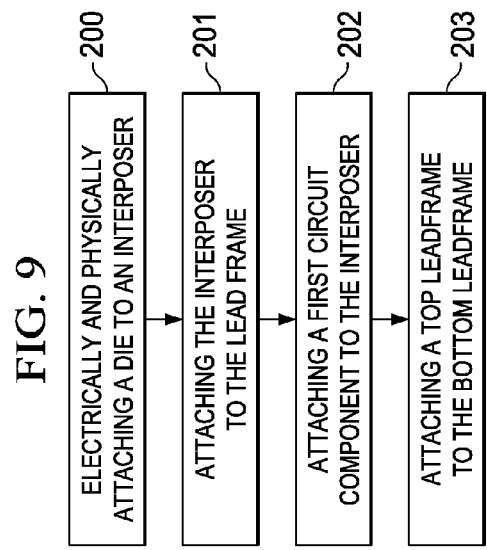
FIG. 9 is a flow chart of a method of making integrated circuit packages.

One method of making an integrated circuit (IC) package is shown in FIG. 9. The method includes electrically and physically attaching a die to an interposer (200); attaching the interposer to a bottom leadframe (201); attaching a first circuit component to the interposer (202); and attaching a top leadframe to the bottom leadframe (203).

Thus, an IC package 120 and a method for making it have been described, which in one embodiment is a dual leadframe module with an interposer 10, two vertical FETs 40, 46, two passive circuit components 94, 96, and a flipchip die 50. Advantageous characteristics of the described IC package 120 may include:

1) The package may have a small form factor for a package with passive components, e.g. in one typical embodiment the package size is 0.8 mm by 1.6 mm by 0.8 mm for a package including a large passive circuit component 94 having dimensions of 11.5 mm by 10 mm by 4.5 mm.
2) The interposer attachment to the exposed bottom leadframe attachment pad portion 64 provides good heat travel from the die 50 out of the package 102.
3) The IC package 120 may be a leaded package with a one piece bottom heat sink 64 which is relatively easy to use in surface mount printed circuit boards.
4) The flipchip die 50 of the package provides good signal integrity and thus good product performance.
5) The dual leadframe and interposer configuration may provide flexible signal routing.

While certain specific embodiments of an IC package have been described in detail herein, various other embodiments of an IC package and production methods therefor will be obvious to those skilled in the art after reading this disclosure. It is intended that the appended claims be broadly construed to cover such alternative embodiments, except to the extent limited by the prior art.

What is claimed is:

1. A method of making an integrated circuit (IC) package comprising:
    creating an interposer leadframe by filling voids in a leadframe with a layer of mold compound;
    electrically and physically attaching a die to the interposer leadframe;
    attaching the interposer leadframe to a bottom leadframe;
    attaching a first circuit component to the interposer leadframe; and
    attaching a top leadframe to the bottom leadframe.

2. The method of claim 1, further comprising attaching the top leadframe to the interposer leadframe with a lead portion having a double downset.

3. The method of claim 1, further comprising:
    attaching a passive circuit component to the top leadframe; and
    covering the top and bottom leadframes, except for portions of leads of the top leadframe and a portion of the bottom leadframe to which the interposer leadframe is attached, with mold compound.

4. The method of claim 3, further comprising electrically connected said top leadframe to said bottom leadframe and said passive circuit.

5. The method of claim 4, further comprising covering said at least one passive circuit device and portions of said top and bottom leadframes with a mold layer.

6. The method of claim 4, further comprising mounting said interposer leadframe on a central pad portion of said bottom leadframe.

7. The method of claim 6, further comprising connecting at least one of a plurality of leads of said top leadframe to said interposer leadframe.

8. The method of claim 6, further comprising providing a field-effect transistor FET having a plurality of metal bumps and connecting said plurality of metal bumps to said interposer leadframe.

9. A method of fabricating an integrated circuit (IC) package, said method comprising:
    a pad with a top surface and a bottom surface;
    providing a leadframe with voids in said leadframe filled with a layer of mold compound resulting in an interposer leadframe, said interposer leadframe having a top surface and a bottom surface;
    patterning a metal layer to have a plurality of inner pad portions and a plurality of outer pad portions on said interposer leadframe;
    integrally connecting said outer pad portions to said inner pad portions;
    attaching said bottom surface of said interposer leadframe to said top surface of said pad;
    overlying at least one field-effect transistor (FET) overlying;
    electrically connecting said at least one (FET) to at least one of said outer pad portions of said patterned metal layer;
    providing a flipchip die having a first surface and an opposite second surface, said second surface having a plurality of solder bumps extending therefrom that are connected to said plurality of inner pad portions of said interposer leadframe;
    a top leadframe having a top surface and a bottom surface and having a plurality of lead portions with inner ends and outer ends;
    connecting at least one of said lead portions at said inner end thereof to at least one of said outer pad portions of said interposer leadframe;
    connecting at least one of said lead portions at said inner end thereof to said at least one FET;
    soldering said bottom leadframe soldered to said top leadframe;
    mounting at least one passive circuit device on said top surface of said top leadframe;
    electrically connecting to at least one of said lead portions of said top leadframe;
    covering said at least one passive circuit device and portions of said top and bottom leadframes with a mold compound;
    exposing outer portions of said lead portions; and
    exposing a bottom surface of said pad.

\* \* \* \* \*